United States Patent
Junge et al.

(10) Patent No.: US 6,997,779 B2
(45) Date of Patent: Feb. 14, 2006

(54) DEVICE FOR THE SIMULTANEOUS DOUBLE-SIDE GRINDING OF A WORKPIECE IN WAFER FORM

(75) Inventors: Joachim Junge, Burghausen (DE); Robert Weiss, Winhoering (DE)

(73) Assignee: Siltronic AG, Munich (DE)

( * ) Notice: Subject to any disclaimer, the term of this patent is extended or adjusted under 35 U.S.C. 154(b) by 0 days.

(21) Appl. No.: 11/070,297

(22) Filed: Mar. 2, 2005

(65) Prior Publication Data

US 2005/0202757 A1 Sep. 15, 2005

(30) Foreign Application Priority Data

Mar. 11, 2004 (DE) .................. 10 2004 011 996

(51) Int. Cl.
*B24B 7/00* (2006.01)

(52) U.S. Cl. ..................................... 451/11; 451/364

(58) Field of Classification Search .............. 451/5, 451/11, 12, 24, 8, 285, 286, 287, 288, 290, 451/364, 365, 367, 379

See application file for complete search history.

(56) References Cited

U.S. PATENT DOCUMENTS 4,497,138 A * 2/1985 Schreiber .................. 451/65
2005/0173377 A1 * 8/2005 Pietsch et al. ............. 216/88

FOREIGN PATENT DOCUMENTS

JP   2000-280155 A   10/2000
JP   2002-307303 A   10/2002

* cited by examiner

*Primary Examiner*—Jacob K. Ackun, Jr.
(74) *Attorney, Agent, or Firm*—Brooks Kushman P.C.

(57) ABSTRACT

A device for the simultaneous double-side grinding of workpiece wafers has two collinear grinding wheels and two hydropads oppositely positioned for hydrostatic bearing of the workpiece, each having at least one hydrostatic bearing and at least one dynamic pressure tube for measuring the spacing between the workpiece and the hydrdopads. The surfaces of the hydropads which face the workpiece are of nonplanar configuration, contoured in such a manner that the spacing between the surface and the workpiece adopts a minimum value near the edge of the hydropads proximate the grinding wheels, this spacing increasing at increasing distance from the grinding wheels. In a further embodiment, at least one bore, through which liquid and abraded material can be discharged from the vicinity of the dynamic pressure tube, is proximate each dynamic pressure tube.

10 Claims, 2 Drawing Sheets

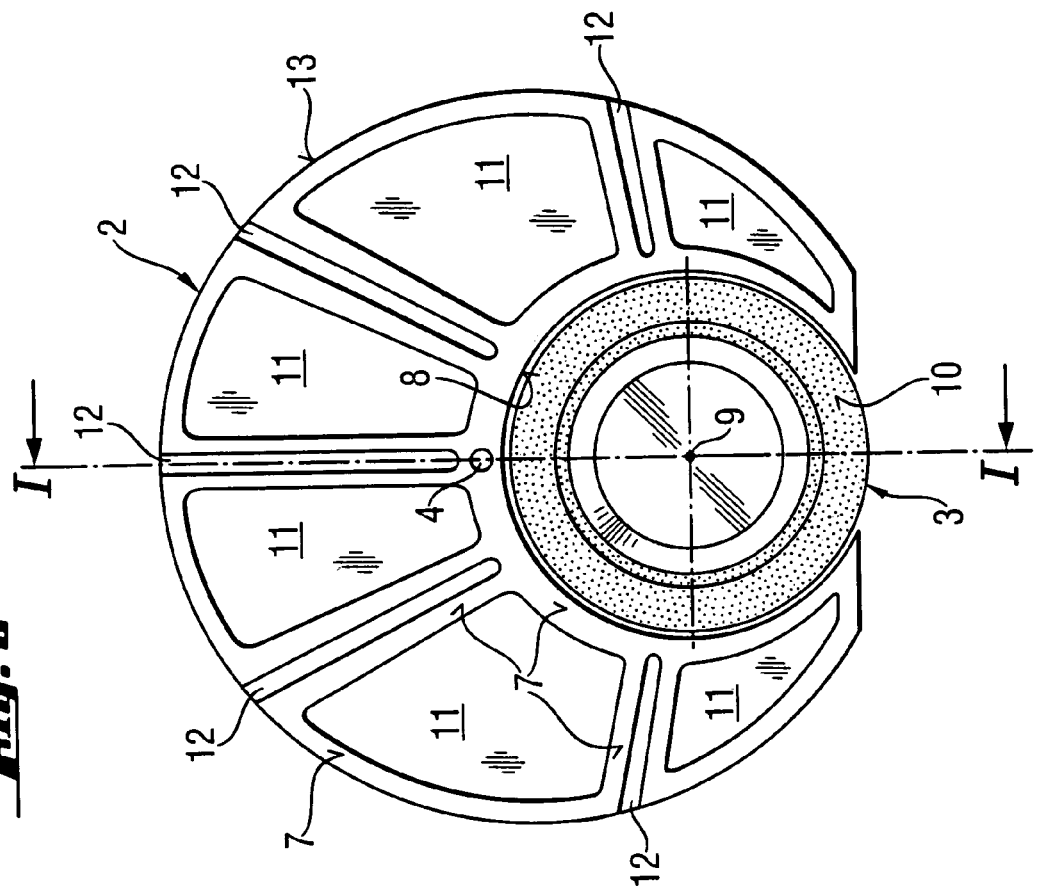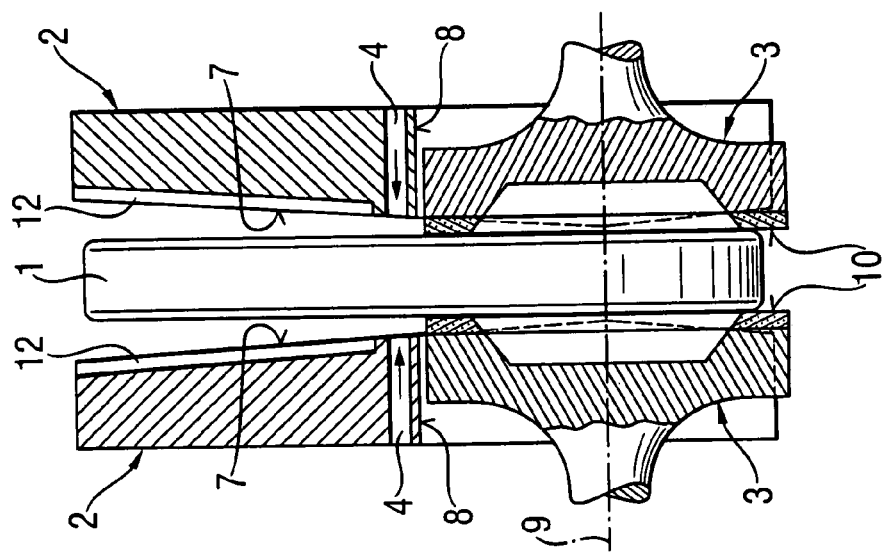

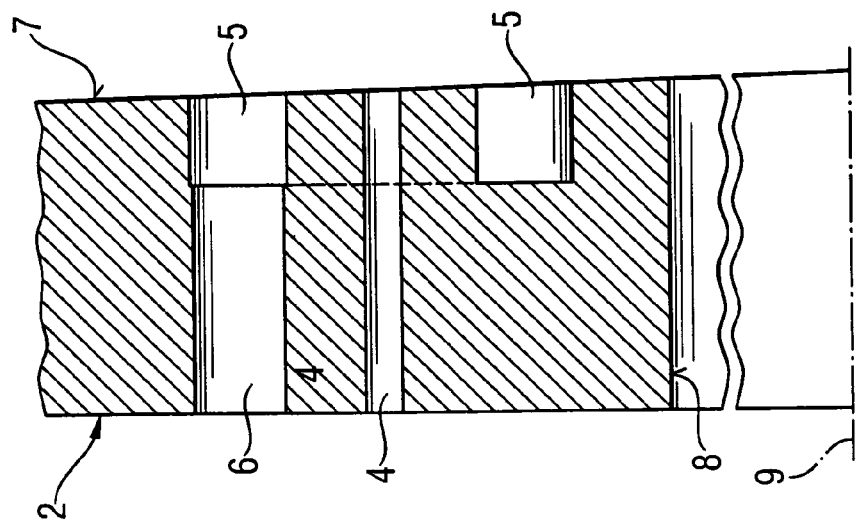
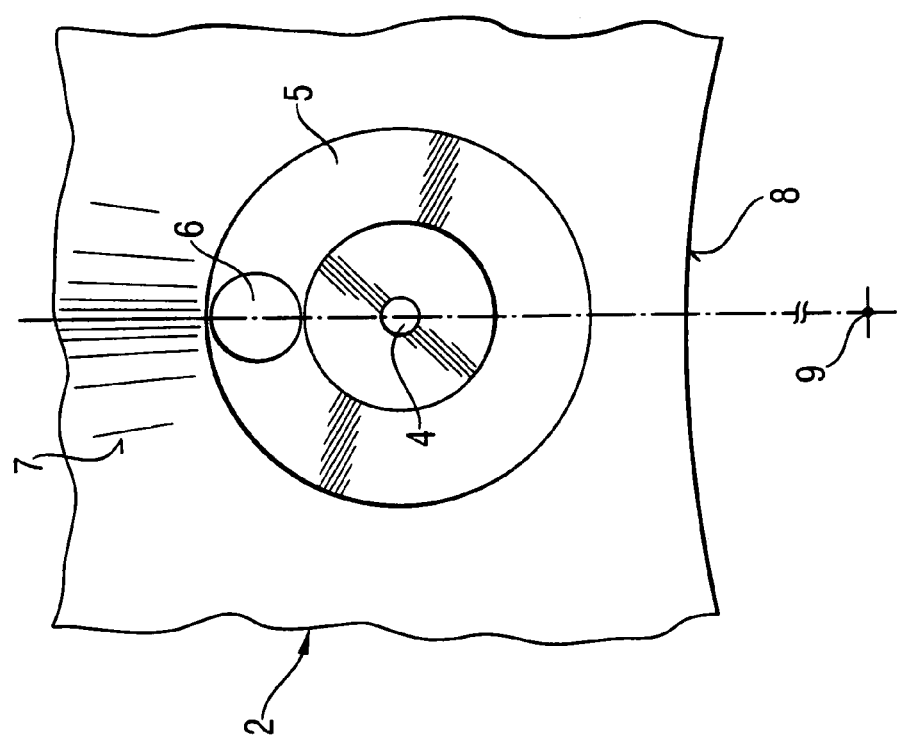

DEVICE FOR THE SIMULTANEOUS DOUBLE-SIDE GRINDING OF A WORKPIECE IN WAFER FORM

BACKGROUND OF THE INVENTION

1. Field of the Invention

The invention relates to a device for the simultaneous double-side grinding of a workpiece in wafer form.

2. Background Art

Devices which are used for the simultaneous grinding of both sides of workpieces in wafer form, for example semiconductor wafers or in particular silicon wafers, are known from the prior art. They are generally known as double-side grinding machines. A further variant of double-side grinding is the process known as double disk grinding, or DDG for short.

DDG machines according to the prior art, as are described, for example, in JP2000-280155A and JP2002-307303A, have two grinding wheels which are positioned opposite one another and the axes of rotation of which are arranged collinearly. During the grinding operation, a workpiece in wafer form which is positioned between the grinding wheels is machined on both sides simultaneously by the two grinding wheels rotating about their axis, while the wafer is held in position by an annular holding and rotation device and at the same time rotated about its own axis. During the grinding operation, the two grinding wheels are advanced in the axial direction until the desired final thickness of the workpiece has been reached.

The holding and rotation device may, for example, comprise friction wheels which engage the edge of the workpiece. However, it may also be a device which surrounds the workpiece in the form of a ring and engages in a score, groove or notch which is present at the periphery of the workpiece. A device of this type is generally known as a notch finger. To machine the entire surface of the workpiece, the workpiece is guided in such a way relative to the grinding wheels that the abrasive grinding segments of the grinding wheels describe an orbit which runs constantly over the center of the workpiece.

In this arrangement, the workpiece is not generally in a fixed position, but rather is held axially in place by two devices for hydrostatic bearing, referred to below as hydropads, arranged on either side of the workpiece. Devices of this type are described in JP2002-280155A. According to the prior art, those surfaces of the two hydropads which face the workpiece are of planar configuration and oriented parallel to one another. Each hydropad comprises a plurality of hydrostatic bearings, between which grooves for discharging the medium used for the hydrostatic positioning (referred to below as the "hydro-bearing medium") and the grinding coolant are arranged.

In each case one or more measuring sensors are integrated in the hydropads, allowing the spacing between the surface of the hydropads and the workpiece surface to be measured during the grinding operation. This spacing measurement is usually carried out with the aid of dynamic pressure tubes as a pneumatic dynamic pressure measurement. The dynamic pressure tubes are designed as simple bores in the edges of the hydrostatic bearings, which form the guide surfaces. To enable the spacing between the hydropads and the workpiece to be measured as close as possible to the location of grinding machining, the dynamic pressure tubes are generally arranged close to that edge of the hydropads which adjoins the grinding wheels.

This spacing measurement is part of a control circuit which is responsible for centering the workpiece between the hydropads. The actuator of this control circuit is the pair of grinding wheels, which are axially displaced with respect to their own axis of rotation as a function of the result of the dynamic pressure measurement, in such a manner that the measured dynamic pressure and therefore the spacing between the workpiece and the hydropad is equal on both sides of the workpiece.

With a bearing arrangement of this nature for a workpiece in wafer form, the following problems arise during the grinding operation, which lead to a deterioration in the geometry of the machined workpiece and in particular in the geometry parameter known as nanotopography:

1. The dynamic pressure measurement is carried out during the grinding operation. This means that the hydro-bearing medium and grinding coolant, which is laden with workpiece chips, pass into the region of the dynamic pressure tubes and can disrupt the dynamic pressure measurement. Consequently, the workpiece is not accurately positioned equidistantly between the hydropads during the grinding operation.
2. Different abrasive characteristics of the two grinding wheels result in different compressive stresses in the surface of the workpiece (subsurface damage), which leads to curvature of the workpiece. This curvature is generally rotationally symmetrical. This in turn means that partial regions of the workpiece will not be located centrally between the hydropads. Since the hydrostatic bearing counteracts this tendency of the workpiece, the workpiece is pressed unevenly onto the two grinding wheels, and a correspondingly rotationally symmetrical curvature is ground into the workpiece.

SUMMARY OF THE INVENTION

Therefore, one object of the invention is to provide improved hydropads, the use of which in a DDG machine leads to improved workpiece geometry following the grinding operation. This and other objects are achieved by a device for the simultaneous double-side grinding of workpieces in wafer form, comprising two substantially circular grinding wheels which are arranged collinearly and the grinding surfaces of which are positioned opposite one another in the axial direction, based on the axes of rotation of the grinding wheels, and which define a midplane located between the grinding wheels and two devices, likewise positioned opposite each other, for hydrostatically bearing the workpiece in wafer form, each comprising at least one hydrostatic bearing and in each case at least one dynamic pressure tube for measuring the spacing between the workpiece and the device for hydrostatic bearing, wherein that surface of each of the two devices for hydrostatic bearing which faces the workpiece is of nonplanar configuration, in such a manner that the spacing between the surface and the midplane between the grinding wheels adopts a minimum value at that edge of the devices for hydrostatic bearing which faces the grinding wheels, and this spacing increases at increasing distance from the grinding wheels.

In the case of an ideally planar workpiece also the spacing between the surface of the hydrostatic pads and the workpiece adopts a minimum value at the location at which the spacing between the surface of the hydrostatic pads and the midplane between the grinding wheels adopts a minimum value. To simplify matters the device according to the invention is described as follows with reference to an ideally planar workpiece.

BRIEF DESCRIPTION OF THE DRAWINGS

The following text describes a preferred embodiment of the invention with reference to figures, in which:

FIG. 1 diagrammatically depicts a workpiece in wafer form which is mounted between two conical hydropads according to the invention and is being machined by two collinearly arranged grinding wheels. The illustration represents a section along a plane which includes the axis of the workpiece and the axes of the grinding wheels.

FIG. 2 shows one of the hydropads illustrated in FIG. 1 and the corresponding grinding wheel in the form of a plan view.

FIG. 3 illustrates a plan view of a preferred embodiment of a dynamic pressure tube, with a circular groove machined into the hydropad surrounding the dynamic pressure tube.

FIG. 4 shows a cross section through the dynamic pressure tube illustrated in FIG. 3.

DETAILED DESCRIPTION OF THE PREFERRED EMBODIMENTS

According to one aspect of the invention, those surfaces of the hydropads which face the workpiece are such that the spacing between workpiece and hydropads is as short as possible at the location of the dynamic pressure tubes, which are generally arranged in the vicinity of the grinding wheels, since the susceptibility to faults increases with the measurement spacing. However, the influence of the workpiece curvature on the position of the workpiece in the hydrostatic bearing becomes ever greater at increasing spacing from the grinding wheel, on account of lever action. Therefore, in the present invention, the spacing between the hydropads and the workpiece increases with an increasing spacing from the grinding wheel or from the dynamic pressure tubes, which are generally arranged in the vicinity of the edge of the grinding wheel. To ensure that this is achieved, the surface of the hydropads which faces the workpiece is of nonplanar design. By way of example, the surface of the hydropads may be of conical or convex design. In the most favorable case, the point of greatest proximity to the workpiece, i.e. for example the point of the cone when a conical design is used, is notationally located in the center of the grinding wheel. The surface of the hydropads may also be provided with steps, in such a manner as to comply with the requirement that the spacing between the hydropads and the workpiece increases at increasing spacing from the grinding wheel or from the dynamic pressure tubes, which are generally arranged in the vicinity of the edge of the grinding wheel. The surface of the hydropads is preferably configured in such a manner that the spacing between the hydropad and the fully ground surface of the workpiece is in the range between 50 and 200 µm, more preferably between 80 and 120 µm, in the vicinity of the grinding wheels, and therefore also the dynamic pressure tubes, and is in the range between 150 and 250 µm, more preferably between 130 and 170 µm, at distant portions.

The invention is also directed to a device for the simultaneous double-side grinding of workpieces in wafer form, comprising two substantially circular grinding wheels which are arranged collinearly, the grinding surfaces of which are positioned opposite one another in the axial direction based on the axes of rotation of the grinding wheels, and two devices, likewise positioned opposite each other, for hydrostatically bearing the workpiece in wafer form, each comprising at least one hydrostatic bearing and in each case at least one dynamic pressure tube for measuring the spacing between the workpiece and the device for hydrostatic bearing, wherein at least one bore, through which liquid and any material abraded by grinding can be discharged from the vicinity of the dynamic pressure tube, is arranged in the vicinity of each dynamic pressure tube.

During the grinding operation, a mix of hydro-bearing medium, grinding coolant and workpiece chips is flushed turbulently around the dynamic pressure tubes. This considerably disrupts the measurement. To solve this problem, this mixture is preferably discharged by the shortest possible route from the critical region in the vicinity of the dynamic pressure tubes. The discharge is effected directly through a bore which is arranged parallel to the dynamic pressure bore, in the immediate vicinity thereof. The disruptive liquid is removed from the critical region through this bore, through the hydropad. To improve operation, it is preferable for a plurality of discharge bores to be arranged in the vicinity of the dynamic pressure tube. The bores are preferably arranged equidistantly with respect to both the adjacent bores and the dynamic pressure tube.

It is also preferable for the shape of the hydropads according to the invention (cf. above) to be combined with the bores and, if appropriate, the annular grooves for discharging liquid from the vicinity of the dynamic pressure tubes.

Another means of improving operation consists in causing the bore, at that surface of the hydropad which faces the workpiece, to end in a groove which surrounds the dynamic pressure tube in the form of a ring. This is likewise preferred. The groove is preferably of circular design, but may also be of some other geometric shape.

The invention is also directed to a device for the simultaneous double-side grinding of workpieces in wafer form, comprising two substantially circular grinding wheels which are arranged collinearly, the grinding surfaces of which are positioned opposite one another in an axial direction based on the axes of rotation of the grinding wheels, and two devices, likewise positioned opposite each other, for hydrostatically bearing the workpiece in wafer form, each comprising at least one hydrostatic bearing and at least one dynamic pressure tube for measuring the spacing between the workpiece and the device for hydrostatic bearing, wherein that surface of each of the two devices for hydrostatic bearing which faces the workpiece, at an edge adjacent to the grinding wheel, has at least one groove which begins at the edge of the device for hydrostatic bearing which does not face the grinding wheels, runs in the direction of the edge facing the grinding wheels, and ends before it reaches that latter edge.

The result of this measure is that as little grinding coolant as possible passes from the region of the grinding wheels between the hydropads and the workpiece and therefore into the region around the dynamic pressure tubes. The quantity of liquid which interferes with the measurement is reduced by this measure, thereby improving the accuracy of the measurement. It is particularly preferable for the latter measure to be combined with the shape of the hydropads according to the invention (cf. above), the bores, and if appropriate, the annular grooves for discharging liquid from the vicinity of the dynamic pressure tubes.

FIGS. 1 and 2 diagrammatically depict a preferred embodiment, wherein a workpiece (1) in wafer form, mounted between two conical hydropads (2) according to the invention, is machined by two collinearly arranged grinding wheels (3). The position of the dynamic pressure tubes (4) is just above the center of the workpiece, i.e. in the vicinity of the edge (8) of the hydropads (2). The spacing between the fixed hydropads (2) and the workpiece surface is measured with the aid of the dynamic pressure tubes (4). The spacing between workpiece (1) and the surface (7) of the hydropads (2) with the surface (7) facing the workpiece is very small at the edge (8) of the hydropad (2) which faces the grinding wheel (3) and therefore also at the location of the dynamic pressure tube (4) and increases at increasing spacing from the grinding wheel (3). The term "surface (7) of the hydrostatic pad" defines the covering area which comprises all areas of the ligaments facing the workpiece (1) but not the retracting areas of the bags (11).

Moreover, the surface (7) of each of the two devices for hydrostatic bearing (2) facing the workpiece (1) has preferably (as can be seen in FIGS. 1 and 2) several grooves (12) which begin at the edge (13) not facing the grinding wheels (3), run in the direction to the edge (8) facing the grinding wheels (3), and end before they reach that edge (8). These grooves (12) serve for discharging the hydro-bearing medium. As the grooves (12) do not reach the edge (8) only little grinding coolant flows from the area of the grinding wheels (3) between the hydrostatic pads (2) and the workpiece (1) and thus in the area around the dynamic pressure tubes (4), so that the accuracy of the distance measurement is increased.

FIGS. 3 and 4 illustrate a preferred embodiment of a dynamic pressure tube (4). A groove (5) has been machined into the hydropad (2) in the form of a circle around the dynamic pressure tube (4). The pneumatic medium from the dynamic pressure tube (4) and the adjoining hydro-bearing medium are collected in this groove (5) and discharged through a bore (6) through the hydropad (2). As a result, a pressure which approximately corresponds to normal ambient pressure is present in the bore (6) and in the groove (5). In this way, the dynamic pressure measurement remains substantially unaffected by the foreign media.

EXAMPLES

A conventional multiwire saw (MWS) was used to separate approx. 10,000 wafers with a thickness of less than 1000 µm from a plurality of silicon single crystals with a diameter of 300 mm. Half of the wafers were then subjected to a double-side grinding process in accordance with the prior art (Comparative Example), while the other half were subjected to a double-side grinding process in accordance with the invention (Example), with in each case approx. 50 µm of material being removed from each side of the wafer. A commercially available double-side grinding machine (DDG machine) of type DXSG 320 produced by Koyo Machine Industries Co., Ltd., Japan was used for this purpose. After the grinding operation, the silicon wafers were etched and polished. The polished silicon wafers were measured by means of Nanomapper (ADE) in SQMM mode. The THA4 values were evaluated.

COMPARATIVE EXAMPLE

The grinding machine was equipped with two hydropads in accordance with the prior art, of which the surface facing the workpiece was planar. The hydropads each had a dynamic pressure tube (4) at the position indicated in FIGS. 1 and 2. Moreover, each of the hydropads had a plurality of grooves originating from that edge of the hydropad which faces the grinding wheel. The measurement of the nanotopography on the finished, polished silicon wafers revealed a mean value of 32.0 nm for the THA4 parameter with a standard deviation of 8.0 nm.

EXAMPLE

The grinding machine was equipped with two hydropads (2) according to the invention, of which the surface (7) facing the workpiece (1) was of conical design, as shown in FIG. 1. The spacing between hydropad and workpiece surface was approx. 50 µm less at the dynamic pressure tubes than at the location furthest away from the grinding wheels (3). The hydropads each had a dynamic pressure tube (4) at the position indicated in FIGS. 1 and 2, and the dynamic pressure tubes were equipped with an annular groove (5) and a bore (6). Moreover, the hydropads did not have any grooves originating from that edge of the hydropad which faces the grinding wheel. The measurement of the nanotopography on the finished, polished silicon wafers revealed a mean value of 26.5 nm for the THA4 parameter with a standard deviation of 4.3 nm.

The changes to the hydropads in accordance with the invention therefore led to a significant improvement in the nanotopography and to a higher process stability, which is reflected in a lower standard deviation. Accurate analysis of the different measures revealed that the change in the shape of the hydropads predominantly leads to the reduced mean value, whereas the provision of the annular groove and the bore for discharging interfering liquid and the elimination of grooves originating from the edge primarily lead to a reduction in the standard deviation.

The device according to the invention can be used in conventional DDG machines for grinding workpieces in wafer form, for example for grinding semiconductor wafers, in particular silicon wafers.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A device for the simultaneous double-side grinding of workpieces in wafer form, comprising two substantially circular grinding wheels arranged collinearly, the grinding surfaces of which are positioned opposite one another in the axial direction based on the axes of rotation of the grinding wheels, and define a midplane located between the grinding wheels, and two devices, likewise positioned opposite each other, for hydrostatically bearing the workpiece in wafer form, each of which comprise at least one hydrostatic bearing and in each case at least one dynamic pressure tube for measuring the spacing between the workpiece and the device for hydrostatic bearing, wherein that surface of each of the two devices for hydrostatic bearing which faces the workpiece is nonplanar, such that the spacing between the surface and the midplane between the grinding wheels has a minimum value proximate that edge of the device for hydrostatic bearing which faces the grinding wheels, and the spacing increases with increasing distance from the grinding wheels.

2. The device of claim 1, wherein that surface of each of the two devices for hydrostatic bearing which faces the workpiece is conical.

3. The device of claim 1, wherein that surface of each of the two devices for hydrostatic bearing which faces the workpiece is convex.

4. The device of claim 1, wherein that surface of each of the two devices for hydrostatic bearing which faces the workpiece is stepped.

5. The device of claim 1, further comprising at least one bore, through which liquid and any material abraded by grinding can be discharged from the vicinity of the dynamic pressure tube, positioned in the vicinity of each dynamic pressure tube.

6. The device of claim 5, wherein the bore, at the surface of the device for hydrostatic bearing of the workpiece in wafer form, terminated within a groove which surrounds the dynamic pressure tube in the form of a ring.

7. The device of claim 1, wherein that surface of each of the two devices for hydrostatic bearing which faces the workpiece, at its edge adjacent to the grinding wheel, does not have any grooves originating from the edge.

8. A device for the simultaneous double-side grinding of a workpiece in wafer form, comprising two substantially circular grinding wheels with collinearly arranged axes of rotation wherein the grinding surfaces of the grinding wheels are positioned opposite one another in axial direction, based on the axes of rotation, and two devices, likewise positioned opposite each other, for hydrostatically bearing the workpiece in wafer form, which each comprise at least one hydrostatic bearing and in each case at least one dynamic pressure tube for measuring the spacing between the workpiece and the device for hydrostatic bearing, wherein at least one bore, through which liquid and any material abraded by grinding can be discharged from the vicinity of the dynamic pressure tube, is arranged in the vicinity of each dynamic pressure tube.

9. The device as claimed in claim 8, wherein the bore, at the surface of the device for hydrostatic bearing of the workpiece in wafer form, ends in a groove which surrounds the dynamic pressure tube in the form of a ring.

10. A device for the simultaneous double-side grinding of a workpiece in wafer form, comprising two substantially circular grinding wheels with collinearly arranged axes of rotation, wherein the grinding surfaces of the grinding wheels are positioned opposite one another in axial direction, based on the axes of rotation, and two devices, likewise positioned opposite each other, for hydrostatically bearing the workpiece in wafer form, which each comprise at least one hydrostatic bearing and in each case at least one dynamic pressure tube for measuring the spacing between the workpiece and the device for hydrostatic bearing, wherein that surface of each of the two devices for hydrostatic bearing which faces the workpiece, has at least one groove which begins at the edge not facing the grinding wheels, runs in the direction of the edge facing the grinding wheels, before it reaches that edge.

* * * * *